(12) United States Patent
Pnini

(10) Patent No.: US 12,504,698 B2
(45) Date of Patent: Dec. 23, 2025

(54) MOUNTING FOR A LITHOGRAPHY SYSTEM, AND LITHOGRAPHY SYSTEM

(71) Applicant: Carl Zeiss SMT GmbH, Oberkochen (DE)

(72) Inventor: Boaz Pnini, Goeggingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 179 days.

(21) Appl. No.: 18/468,438

(22) Filed: Sep. 15, 2023

(65) Prior Publication Data

US 2024/0004315 A1   Jan. 4, 2024

Related U.S. Application Data

(63) Continuation of application No. PCT/EP2022/051770, filed on Jan. 26, 2022.

(30) Foreign Application Priority Data

Mar. 24, 2021   (DE) .......................... 102021202893.4

(51) Int. Cl.
G03F 7/20         (2006.01)
G03F 7/00         (2006.01)

(52) U.S. Cl.
CPC ................................ G03F 7/70825 (2013.01)

(58) Field of Classification Search
CPC ............. G03F 7/70825; G03F 7/70975; G02B 7/1822
See application file for complete search history.

(56) References Cited

U.S. PATENT DOCUMENTS

| | | | |
|---|---|---|---|
| 2003/0234989 A1* | 12/2003 | Oshino | ..................... G02B 7/00 359/849 |
| 2013/0314771 A1 | 11/2013 | Geuppert et al. | |
| 2017/0357164 A1 | 12/2017 | Prochnau et al. | |
| 2019/0004431 A1 | 1/2019 | Zweering | |
| 2019/0339625 A1 | 11/2019 | Zweering et al. | |
| 2021/0080841 A1 | 3/2021 | Kugler et al. | |

FOREIGN PATENT DOCUMENTS

| | | |
|---|---|---|
| DE | 10 2008 044 365 A1 | 6/2009 |
| DE | 10 2014 215 159 A1 | 9/2014 |
| DE | 10 2015 201 249 A1 | 7/2016 |
| DE | 10 2016 204 143 A1 | 9/2017 |
| DE | 10 2017 200 636 A1 | 7/2018 |
| DE | 10 2019 214 242 A1 | 3/2021 |

OTHER PUBLICATIONS

Translation of International Search Report for corresponding Appl No. PCT/EP2022/051770, dated May 16, 2022.

\* cited by examiner

*Primary Examiner* — Mesfin T Asfaw
(74) *Attorney, Agent, or Firm* — Fish & Richardson P.C.

(57) ABSTRACT

A mounting for a lithography system comprises: a mounted element; a mounting element; and fastening elements which together secure the mounted element relative to the mounting element in at least one degree of freedom. A spacing is provided between the mounted element and the mounting element in the direction of the at least one degree of freedom, and each fastening element exerts a force on the mounted element exclusively in the direction of the at least one degree of freedom.

18 Claims, 7 Drawing Sheets

MOUNTING FOR A LITHOGRAPHY SYSTEM, AND LITHOGRAPHY SYSTEM

CROSS-REFERENCE TO RELATED APPLICATIONS

The present application is a continuation of, and claims benefit under 35 USC 120 to, international application PCT/EP2022/051770, filed Jan. 26, 2022, which claims benefit under 35 USC 119 of German Application No 10 2021 202 893.4, filed Mar. 24, 2021. The entire disclosure of each these applications is incorporated by reference herein.

FIELD

The present disclosure relates to a mounting for a lithography apparatus, and to a lithography apparatus comprising such a mounting.

BACKGROUND

Microlithography is used for producing microstructured components, for example, integrated circuits. The microlithography process is carried out using a lithography apparatus, which has an illumination system and a projection system. The image of a mask (reticle) illuminated via the illumination system is projected here via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range from 0.1 to nm, in particular 13.5 nm, are currently under development. In the case of such EUV lithography apparatuses, because of the generally high absorption of light of this wavelength by most materials, reflective optical units, that is to say mirrors, are commonly used instead of—as previously—refractive optical units, that is to say lens elements.

The mirrors may for example be fastened to a supporting frame (force frame) and be designed as at least partially manipulable, in order to allow a movement of a respective mirror in up to six degrees of freedom, and consequently a highly accurate positioning of the mirrors in relation to one another, in particular in the picometers range. This allows changes in the optical properties that occur for instance during the operation of the lithography apparatus, for example as a result of thermal influences, to be compensated for.

Sensors provided on a sensor frame can be provided for determining the position of the mirrors. With the aid of the sensors, the positioning of the mirrors can be checked and, if appropriate, corrected. The supporting frame and the sensor frame are mechanically decoupled from one another. Mechanical decoupling should be understood to mean that no forces, vibrations and/or oscillations are transmitted from the sensor frame to the supporting frame, or vice versa. This can be achieved for example via a very soft and/or resilient mounting of the sensor frame.

In order to prevent damage to the supporting frame and/or the sensor frame in the event of tilting or transport of the lithography apparatus, what are referred to as transport locks (transport blocking elements) may be provided between the supporting frame and the sensor frame, which transport locks in particular prevent the supporting frame and the sensor frame from striking against one another. DE 10 2016 204 143 A1 discloses an example of such a transport lock which, depending on a measurement result of a measuring device which measures a width of a spacing between the supporting frame and the sensor frame, is inserted into the spacing and thus limits a relative movement of the supporting frame relative to the sensor frame.

Similar transport locks can be fixedly connected to the supporting frame and grip displaceably into a recess in the sensor frame. For this purpose, a gap of up to approx. 150 µm can be provided between the transport locks and the sensor frame such that contactless securing of the sensor frame on the supporting frame is made possible. The gap can be used to prevent high torques. In the event of impacts with a force of the order of magnitude of between 2 and 3 g, as may occur during transport, the transport locks abruptly collide with the sensor frame, which may cause damage to the supporting frame, the sensor frame and/or the transport locks. In some cases, particles may also arise due to abrasion in the region in which the transport locks are displaced. These particles can have an adverse effect on the function of the lithography apparatus.

SUMMARY

According to a first aspect, a mounting for a lithography apparatus is proposed. The mounting comprises:
 a mounted element;
 a mounting element; and
 fastening elements, which together secure the mounted element relative to the mounting element in at least one degree of freedom; wherein
 a spacing in the direction of at least one degree of freedom between the mounted and the mounting element is provided, and
 each fastening element exerts a force on the mounted element exclusively in the direction of the at least one degree of freedom.

By virtue of the fact that each fastening element exerts a force on the mounted element exclusively in one degree of freedom, the forces exerted on the mounted element can be optimized. Each fastening element can exert exclusively an axial force on the mounted element. This can help prevent the fastening elements from being bent in the event of impacts and stresses occurring in the fastening elements. In particular, torques may be prevented. This can reduce damage to the mounted element, the mounting element and/or the fastening elements during transport. Reliable mounting for securing the mounted element on the mounting element can be provided with little effort.

The mounted element can be a sensor frame. The mounting element can be a supporting frame. However, the mounted element may also be another actuable element of the lithography apparatus, such as an actuable mirror. In such a case, the mounting element can be an element of the lithography apparatus, which element interacts with the actuable mounted element.

The mounting can comprise at least two fastening elements, but optionally at least six. The fact that the fastening elements secure the mounted element relative to the mounting element in at least one degree of freedom means that the fastening elements can help prevent movement of the mounted element relative to the mounting element in the at least one degree of freedom. Optionally, the fastening elements prevent any relative movement between the mounting element and the mounted element. For example, the fastening elements do not permit any displaceability of the mounted element relative to the mounting element, in particular any displaceability of the mounted element parallel to the mounting element. Minimal movability of the mounted element relative to the mounted element can be achieved by the flexibility of the fastening elements. However, this is negligible.

The term "degree of freedom" refers to the possibility of movement of the mounting. Different degrees of freedom are possibilities of movement independently from one another. A two-dimensional mounting has a total of three degrees of freedom, while a three-dimensional mounting has a total of six degrees of freedom.

The spacing between the mounting and mounted element can be provided in such a way that the mounted element has no direct contact with the mounting element. There can be a spacing anywhere between the mounted element and the mounting element. The spacing can also be considered to be an air spacing or gap. The fact that the spacing is aligned in the direction of the at least one degree of freedom means that, in the direction of the at least one degree of freedom, a spacing is provided between the mounted and the mounting element. For example, the mounted element and the mounting element do not touch in the direction of the at least one degree of freedom. The width of the spacing is, for example, at least 2 cm, such as at least 4 cm, for example at least 10 cm. The width of the spacing can be defined as the smallest spacing between opposite surfaces of the mounting and the mounted elements.

For example, the fastening elements are at least partially made of steel, in particular X90 steel. However, the fastening elements may also comprise other materials of good strength. It is to be considered that the fastening elements can withstand the impacts that occur during transport, which are often in the order of magnitude of 2 g to 3 g.

In embodiments, each fastening element exerts a force on the mounted element exclusively in the direction of the at least one degree of freedom. This means that a fastening element exerts force on the mounted element only in one direction. The various fastening elements can exert a force on the mounted element in the direction of different degrees of freedom. However, it is each fastening element exerts force on the mounted element only in one single direction (corresponding to a single degree of freedom).

For example, no or at least merely negligible forces in other directions than the direction of the at least one degree of freedom of the fastening element are exerted on the mounted element by each fastening element.

The fastening elements can be fixedly connected to the mounting element and/or to the mounted element. In particular, relative movements between the fastening elements and the mounting element and/or between the fastening elements and the mounted element may not made possible. As a result, particle abrasion, which arises when the fastening elements rub or impact against the mounting element and/or the mounted element, can be prevented.

According to one embodiment, each fastening element exerts exclusively a tensile force and/or a compressive force on the mounted element.

The tensile force and/or compressive force exerted by the fastening element on the mounted element can be, in particular, a force acting perpendicularly to the surface of the mounted element on which the force acts. In particular, the tensile force can be a force that pulls the mounted element in the direction of the mounting element. The compressive force can be a force that pushes the mounted element away from the mounting element. The tensile and/or compressive forces may also be referred to as axial forces.

For example, no or at least only negligible shearing and torques are exerted on the mounted element.

According to an embodiment, the fastening elements are formed rigidly only in the direction of the at least one degree of freedom.

The fastening elements may be in each case formed rigidly only in one direction (in the sense of being rigid or non-bendable). Optionally, they are formed rigidly only along their axial direction of extent (longitudinal direction). This means that a loading on the fastening elements in the longitudinal direction (in particular in compression or tension) does not lead to a significant change in length along the longitudinal direction.

Optionally, the fastening element is at least 10 times, 15 times or 20 times more rigid or stiffer along the rigid direction than in the other directions (especially in the transverse directions).

Along the other directions, the fastening elements can be designed flexibly (in the sense of being bendable). Loading the fastening elements in directions other than the longitudinal direction may cause the fastening elements to bend along these directions.

In embodiments, the fastening elements can absorb and transfer forces only along the rigid direction. The fastening elements cannot absorb or transmit forces along the flexible directions. This can result in a function of the fastening elements that corresponds to that of a stretched rope: the rope transmits forces only along the tensile direction.

The fact that the fastening elements are flexible along certain directions does not mean that the fastening elements are made of a flexible material. Rather, the flexibility can result merely from a length ratio of the fastening element. In order to achieve rigidity along only one direction, the fastening elements can be significantly longer (along the axial direction of extent) than wide (diameter).

For example, a length of the fastening elements is at least 10 times, such as at least 15 or times, greater than a diameter of the fastening elements. For example, the diameter of the fastening elements is 12 mm, while the length of the fastening elements can be between 20 and 30 cm. The axial direction of extent of the fastening elements corresponds in particular to the direction of the at least one degree of freedom.

According to an embodiment, the mounted element and the mounting element are mechanically decoupled from each other apart from the fastening elements.

The only mechanical coupling between the mounting and the mounted element can be ensured by the fastening elements. Mechanical decoupling of the supporting frame from the sensor frame should preferably be understood to mean that no or at least negligible oscillations, forces and/or vibrations are transmitted from the supporting frame to the sensor frame, and vice versa. This can be achieved by the sensor frame being mounted with the aid of a soft mounting or actuator system. By way of example, the sensor frame can be mounted with the aid of very soft spring elements. Optionally, the supporting frame is grounded.

According to an embodiment, the mounting further comprises an optical element, wherein the mounting element is a supporting frame for carrying the optical element and the mounted element is a sensor frame.

The mounting can be part of a projection system of the lithography apparatus. The projection system can also be referred to as a projection lens. The supporting frame may also be referred to as a force frame. The optical element may have one or more lens elements and/or mirrors. The fact that the supporting frame carries the optical element should be understood to mean that the optical element is coupled to the supporting frame with the aid of weight force compensation units and Lorentz actuators. In particular, the optical element is manipulable, that is to say adjustable and/or deformable, for positioning or position correction of same. The supporting frame and/or the sensor frame can be produced from a ceramic material or a metallic material. In particular, the supporting frame can be produced from a non-oxide ceramic, for example from a silicon carbide. Optionally, at least the supporting frame is produced from an electrically conductive material. In particular, a multiplicity of sensors can be provided on the sensor frame, the sensors being configured to detect the positioning of the optical element. With the aid of the position of the optical element as determined by the sensors, the alignment of the optical element can be corrected with the aid of actuators, in particular Lorentz actuators, coupled to the supporting frame.

According to a further embodiment:
if the fastening elements together secure the mounted element relative to the mounting element in a plurality of degrees of freedom,
a spacing in the direction of the respective plurality of degrees of freedom, along which the fastening elements together secure the mounted element relative to the mounting element, between the mounted and the mounting element is in each case provided,
for each degree of freedom of the plurality of degrees of freedom, at least one fastening element, which exerts a force on the mounted element exclusively in the direction of this degree of freedom, is provided.

The term "a plurality of degrees of freedom" refers in particular to the degrees of freedom or directions in which the fastening elements together secure the mounted element relative to the mounting element. For each degree of freedom in which the fastening elements secure the mounted element relative to the mounting element, a spacing between the mounted and the securing element is provided in particular. Furthermore, for each degree of freedom from the plurality of degrees of freedom, at least one fastening element can be provided, which exerts a force on the mounted element only in the direction of this degree of freedom.

According to an embodiment, the mounting comprises at least six fastening elements, of which six fastening elements each exert a force on the mounted element exclusively in the direction of different degrees of freedom.

The number of degrees of freedom in which the fastening elements together secure the mounted element relative to the mounting element can be at least six for the three-dimensional securing of the mounted element. For each of these plurality of degrees of freedom, at least one fastening element can be provided, which exerts a force on the mounted element exclusively along the direction of this degree of freedom.

According to an embodiment, the mounting comprises precisely six fastening elements.

Six is the smallest number of fastening elements for securing the mounted element in three dimensions relative to the mounting element.

According to an embodiment, at least two of the fastening elements exert a force in the same degree of freedom on the mounted element.

To provide more than two non-coaxial fastening elements for the same degree of freedom can be desirable in that they can share the force that occurs, for example, during transport.

According to an embodiment, the at least two fastening elements, which exert a force on the mounted element in the same degree of freedom, are arranged coaxially, in particular such that their forces act on the mounted element in opposite directions.

One of the fastening elements can exert a tensile force in the direction of the degree of freedom on the mounted element, while another of the fastening elements can exert a compressive force in the direction of the same degree of freedom on the mounted element. Together, the two coaxial fastening elements restrict the movement of the mounted element relative to the mounting element in both directions in the same degree of freedom.

According to an embodiment, the mounting comprises at least twelve fastening elements, of which in each case at least two are arranged coaxially.

In particular, in each case two fastening elements are provided per degree of freedom.

According to a further embodiment:
each fastening element exerts exclusively a compressive force on the mounted element in the direction of the at least one degree of freedom, or
each fastening element exerts exclusively a tensile force on the mounted element in the direction of the at least one degree of freedom.

If all fastening elements exert exclusively a tensile force on the mounted element, the mounted element is held in particular exclusively in tension on the mounting element. The principle behind the holding of the mounted element in tension is similar to the principle of a spider's web, which holds prey exclusively in tension. A single thread of the spider's web is flexible and typically not sufficient to restrict movements of the prey. However, the interaction of a plurality of threads, which act in different directions, allows the prey to be secured. In the mounting described, the fastening elements correspond to the threads of the spider's web.

The fastening of the mounted element exclusively by compressive force is subject to an equivalent principle, with reverse forces. In both cases (only tensile force or only compressive force), the fastening of the mounted element at one point is achieved by the fastening elements acting together on the mounted element. Removing one fastening element may compromise the stability of the support of the mounted element.

According to an embodiment, the mounting element comprises a first opening and the mounted element comprises a second opening lying opposite the first opening, wherein one of the fastening elements projects at least partially into the first opening and into the second opening.

The openings can be aligned coaxially with each other. The openings can be bores or the like. An internal thread can be provided on an inner surface of the first and/or second opening. The diameter of the openings can correspond to the diameter of the fastening elements. The diameter of the openings can be between 3 and 20 mm, such as between 5 and 12 mm.

According to an embodiment, at least one fastening element is formed as a pin or a screw, wherein the pin or the screw can be inserted at least partially into the first opening and into the second opening.

For example, the diameter of the fastening elements is between 3 and 20 mm, such as between 5 and 20 mm. The dimensions of the fastening elements and the openings are greatly dependent on the dimensions and weights of the mounted element and mounting element. Generally speaking, however, it can be said that the diameter of the fastening elements, which exert a force only in one degree of freedom, can be kept small compared to the diameter of fastening elements, which also have to withstand shearing forces or the like. Openings and fastening elements with small diameters can mean that less construction space is used for the openings and fastening elements on the mounted element and mounting element.

Furthermore, a length of the fastening elements can be significantly greater than the diameter of the fastening elements. A length of the fastening elements (along an axial direction of extent, which corresponds in particular to the direction of the at least one degree of freedom) is such as at least 10 cm, for example at least 15, 20 or 30 cm. The fastening elements are therefore elongate elements, which are rigidly formed in particular only along the axial direction of extent and are otherwise flexible.

In particular, a pin can be an elongate rod without a thread. The screw has a thread, at least in some section or sections. A commercially available screw is a tension element which merely exerts tension on the mounted element. In order to be used as a tension/compression element, the screw is additionally fastened to the supporting frame. A nut can be used for this purpose. Alternatively, the screw can also be configured with a thread at its head end to allow fastening to the supporting frame.

According to an embodiment, at least one fastening element is formed as a cable, such as as a wire cable.

According to an embodiment, the fastening elements are removably coupled to the mounting element and to the mounted element.

The fastening elements can be fastened to the mounted and mounting element if the lithography apparatus is to be transported, tilted, might be subject to earthquakes and/or is to be protected for other reasons. They can then be removed again for use with the lithography apparatus. When the fastening elements are configured as screws, fastening and removing the fastening elements is associated with particularly little effort.

According to a second aspect, a lithography apparatus is proposed, which comprises a mounting according to the first aspect or according to one embodiment of the first aspect.

In particular, the lithography apparatus is an EUV or DUV lithography apparatus. EUV stands for "extreme ultraviolet" and refers to a wavelength of the working light of between 0.1 and 30 nm. DUV stands for "deep ultraviolet" and refers to a wavelength of the working light of between 30 and 250 nm.

The embodiments and features described for the mounting apply correspondingly to the proposed lithography apparatus, and vice versa.

"A" or "an" in the present case should not necessarily be understood to be restricted to precisely one element. Rather, a plurality of elements, such as two, three or more, may also be provided. Nor should any other numeral used here be understood to the effect that there is a restriction to exactly the stated number of elements. Instead, unless indicated otherwise, numerical deviations upward and downward are possible.

Further possible implementations of the disclosure also include combinations which were not mentioned explicitly of features or embodiments described above or hereinafter with respect to the exemplary embodiments. In this case, a person skilled in the art will also add individual aspects as improvements or supplementations to the respective basic form of the disclosure.

Further refinements and aspects of the disclosure are the subject matter of the dependent claims and also of the exemplary embodiments of the disclosure that are described below. In addition, the disclosure will be explained in detail hereinafter on the basis of preferred embodiments with reference to the appended figures.

DETAILED DESCRIPTION

Unless indicated otherwise, elements that are identical or functionally identical have been provided with the same reference signs in the figures. It should also be noted that the illustrations in the figures are not necessarily true to scale.

Figure 1A:
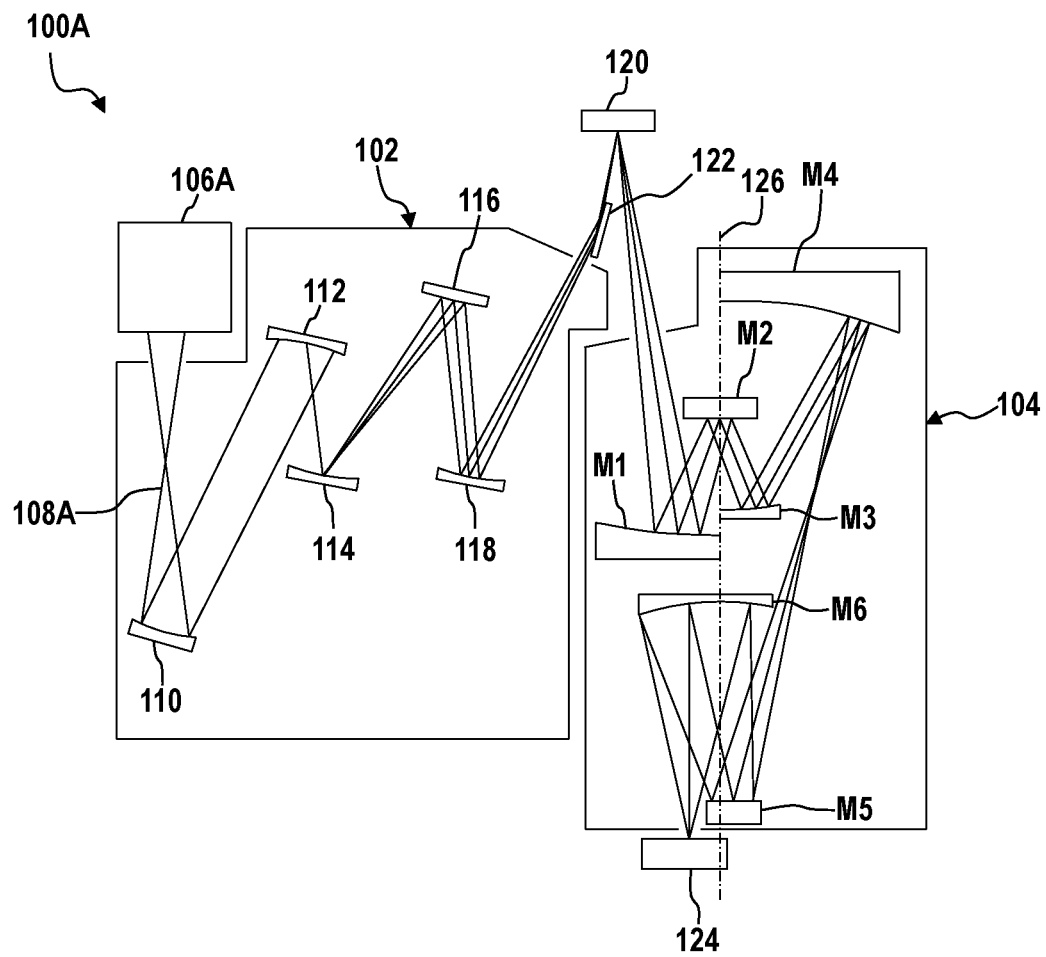
FIG. 1A shows a schematic view of an embodiment of an EUV lithography apparatus.

FIG. 1A shows a schematic view of an EUV lithography apparatus 100A comprising a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation apparatus (not shown). The vacuum housings are surrounded by a machine room (not shown), in which drive apparatuses for mechanically moving or setting optical elements are provided. Furthermore, electrical controllers and the like may also be provided in this machine room.

The EUV lithography apparatus 100A comprises an EUV light source 106A. A plasma source (or a synchrotron), which emits radiation 108A in the EUV range (extreme ultraviolet range), which is to say for example in the wavelength range of 5 nm to 20 nm, may be provided for example as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A comprises five mirrors 110, 112, 114, 116, 118. After passing through the beam shaping and illumination system 102, the EUV radiation 108A is guided onto a photomask (reticle) 120. The photomask 120 is likewise formed as a reflective optical element and may be arranged outside the systems 102, 104. Furthermore, the EUV radiation 108A may be directed at the photomask 120 via a mirror 122. The photomask 120 comprises a structure which is imaged onto a wafer 124 or the like in reduced form via the projection system 104.

The projection system 104 (also referred to as a projection lens) has six mirrors M1 to M6 for imaging the photomask 120 onto the wafer 124. In this case, individual mirrors M1 to M6 of the projection system 104 may be arranged symmetrically in relation to an optical axis 126 of the projection system 104. It should be noted that the number of mirrors M1 to M6 of the EUV lithography apparatus 100A is not restricted to the number shown. A greater or lesser number of mirrors M1 to M6 may also be provided. Furthermore, the mirrors M1 to M6 are generally curved on their front side for beam shaping.

Figure 1B:
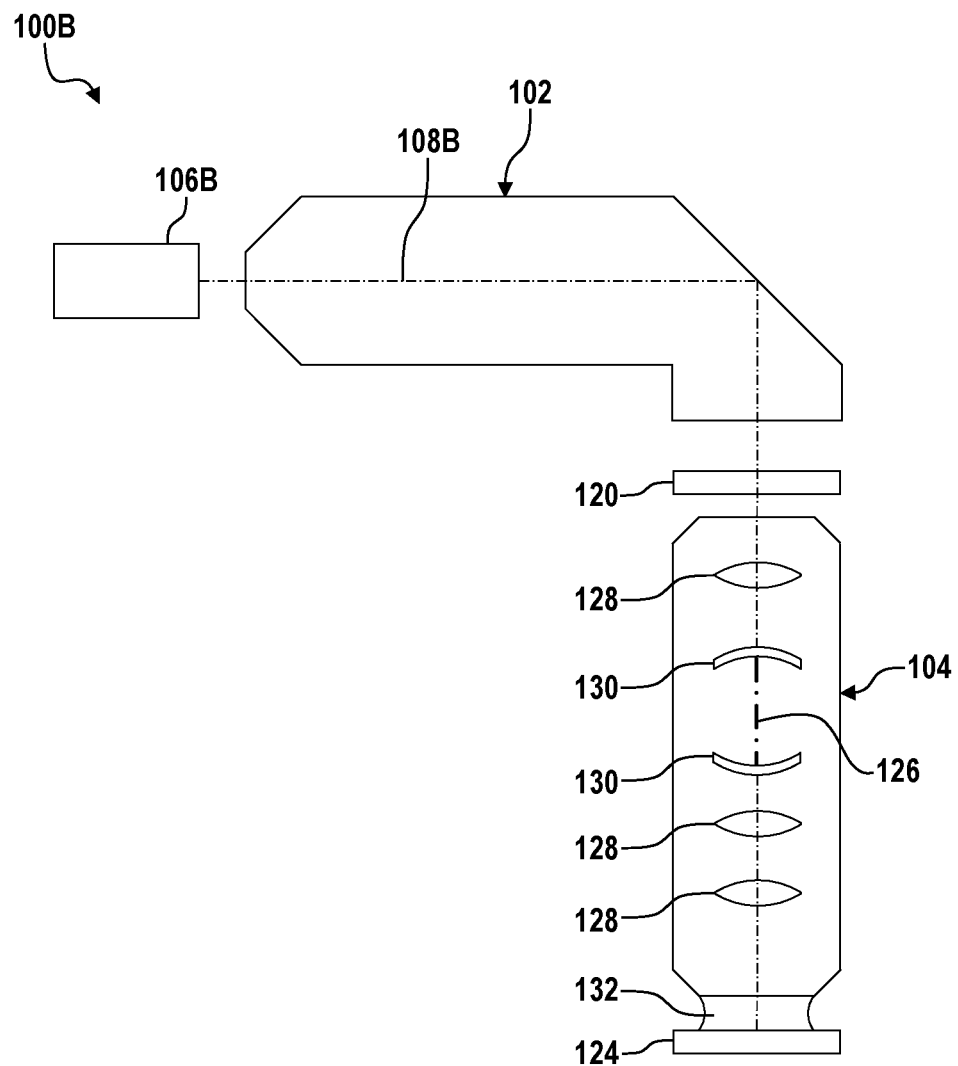
FIG. 1B shows a schematic view of an embodiment of a DUV lithography apparatus.

FIG. 1B shows a schematic view of a DUV lithography apparatus 100B, which comprises a beam shaping and illumination system 102 and a projection system 104. In this case, DUV stands for "deep ultraviolet" and denotes a wavelength of the working light of between 30 nm and 250 nm. As has already been described with reference to FIG. 1A, the beam shaping and illumination system 102 and the projection system 104 can be arranged in a vacuum housing and/or be surrounded by a machine room with corresponding driving apparatuses.

The DUV lithography apparatus 100B comprises a DUV light source 106B. An ArF excimer laser, which emits radiation 108B in the DUV range at for example 193 nm, may be provided for example as the DUV light source 106B.

The beam shaping and illumination system 102 shown in FIG. 1B guides the DUV radiation 108B onto a photomask 120. The photomask 120 is formed as a transmissive optical element and may be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 may be arranged symmetrically in relation to an optical axis 126 of the projection system 104. It should be noted that the number of lens elements 128 and mirrors 130 of the DUV lithography apparatus 100B is not restricted to the number shown. A greater or lesser number of lens elements 128 and/or mirrors 130 may also be provided. Furthermore, the mirrors 130 are generally curved on their front side for beam shaping.

An air gap between the last lens element 128 and the wafer 124 may be replaced by a liquid medium 132 having a refractive index>1. The liquid medium 132 may be for example high-purity water. Such a set-up is also referred to as immersion lithography and has an increased photolithographic resolution. The medium 132 may also be referred to as an immersion liquid.

Figure 2:
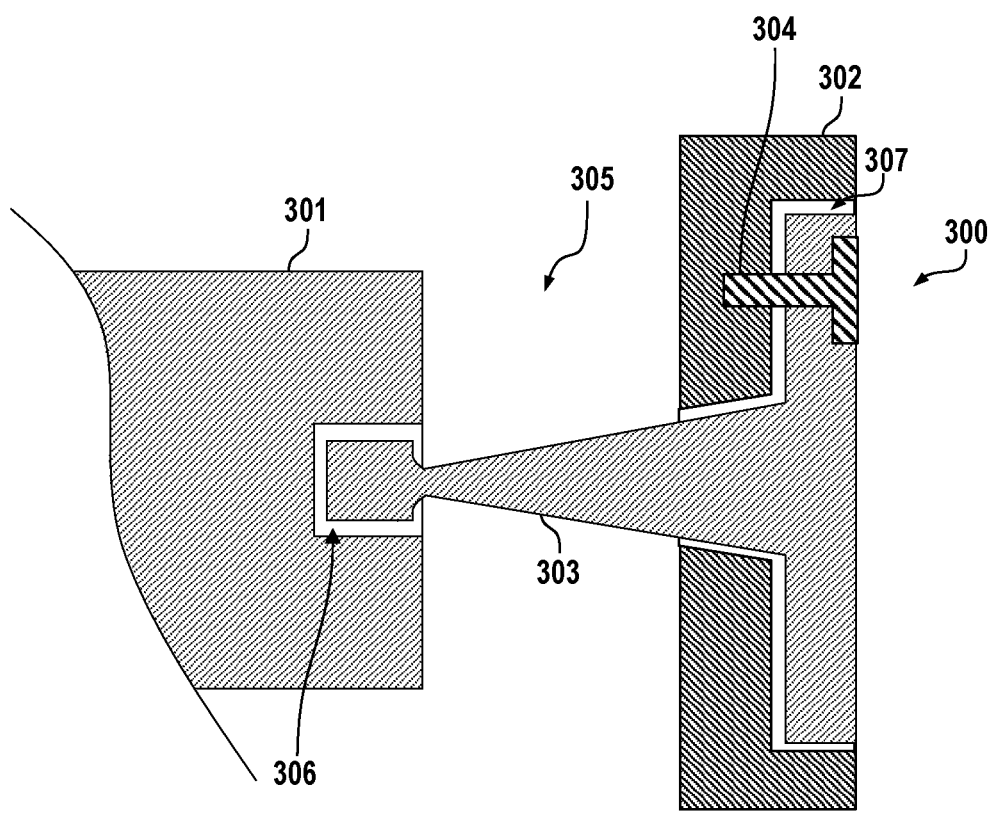
FIG. 2 shows a schematic sectional view of a known mounting.
Figure 2:
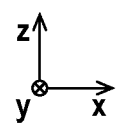

FIG. 2 shows a schematic sectional view of a mounting 300 known from the prior art. The mounting 300 comprises a supporting frame 302, which holds one of the mirrors M1-M6, 110, 112, 114, 116, 118, 130 or one of the lens elements 128, and a sensor frame 301 mechanically decoupled from the supporting frame 302 for determining the position of the optical element M1-M6, 110, 112, 114, 116, 118, 128, 130. The sensor frame 301 and the supporting frame 302 are arranged spaced apart from each other along the x-direction shown in FIG. 2 in such a manner that there is a spacing 305 between the sensor frame 301 and the supporting frame 302 in the x-direction. Along the x-direction, a width of the spacing 305 is approximately 5 cm.

In order to prevent damage to the sensor frame 301 and/or the supporting frame 302 for example during transport of the lithography apparatus 100A, 100B comprising the mounting 300, a transport lock 303 is used. This transport lock 303 is inserted into a receptacle 307 in the supporting frame 302 and fastened to the supporting frame 302 via a screw 304. The transport lock 303 extends in the direction of the sensor frame 301 and into the latter. The sensor frame 301 accommodates an end portion of the transport lock 303. Between the transport lock 303 and the sensor frame 301, a gap 306 is provided such that the transport lock 303 is secured contactlessly on the sensor frame 301. The gap 306 has a width of up to approximately 150 µm. The gap 306 allows movement of the transport lock 303 relative to the sensor frame 301 along the x-, y- and z-directions. This also ensures a movement of the sensor frame 301 relative to the supporting frame 302. The forces exerted by the transport lock 303 on the sensor frame 301 are both axial forces (along the x-direction) and radial forces (along the y- and z-directions). The movable mounting of the transport locks 303 on the sensor frame 301 prevents torques.

When transporting the lithography apparatus 100A, 100B, large impact forces (of the order of magnitude of between 2 and 3 g) may occur and the transport locks 303 may abruptly collide with the sensor frame 301, as a result of which damage to the supporting frame 302, the sensor frame 301 and/or the transport locks 303 may occur. To prevent such damage, a diameter of the transport locks 303 can be increased. However, the construction space used for fastening the transport locks 303 is thereby increased.

In some cases, the collision of the transport lock 303 with the sensor frame 301 may also lead to particle abrasion. These particles can have an adverse effect on the operation of the lithography apparatus 100A, 100B.

Figure 3:
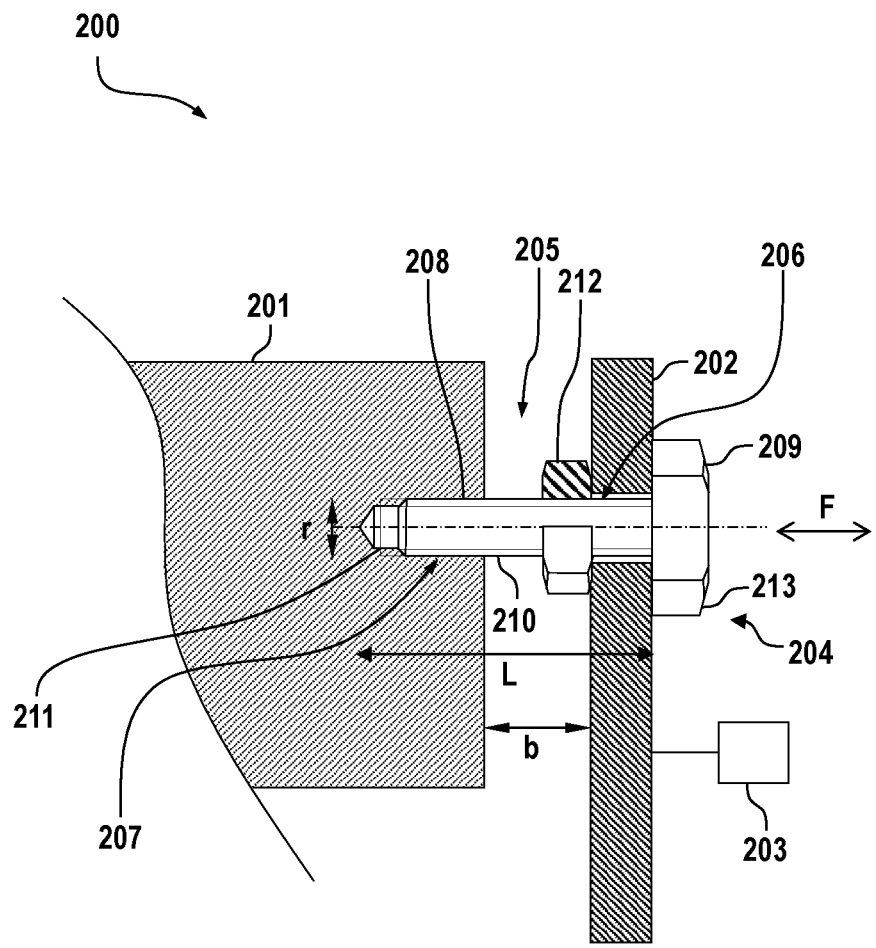
FIG. 3 shows a schematic sectional view of a part of a mounting according to a first embodiment.

FIG. 3 shows a schematic sectional view of a part of a mounting 200 according to a first embodiment. The mounting 200 comprises a mounted element 201, which is configured here as a sensor frame, and a mounting element 202, which is configured here as a supporting frame.

The mounting 200 may be part of the projection system 104 according to FIGS. 1A and 1B. The supporting frame 202 holds an optical element 203, which is configured as one of the mirrors M1-M6, 110, 112, 114, 116, 118, 130 or as one of the lens elements 128, which have been described in conjunction with FIGS. 1A and 1B. Alternatively, the optical element 203 can also be an optical grating or a λ plate. The mounting 200 can comprise a multiplicity of optical elements 203 of this type.

The force frame or supporting frame 202 is coupled to the optical element 203. Weight force compensation units on the basis of permanent magnets can be used for mounting the optical element 203 on the supporting frame 202. The compensation force generated by such a weight force compensation unit acts counter to the weight force of the optical element 203, and corresponds substantially thereto in terms of its absolute value. By contrast, a movement of optical element 203—in particular also in the vertical direction—can be actively controlled by way of what are referred to as Lorentz actuators. Such a Lorentz actuator in each case comprises an energizable coil and, at a distance from it, a permanent magnet. These together generate an adjustable magnetic force for controlling the movement of the optical element 203.

That is to say that the optical element 203 is manipulable, in particular adjustable and/or deformable, for positioning or position correction of same. One or more actuators, in particular Lorentz actuators, can be provided for this purpose. The supporting frame 202 can support a multiplicity of optical elements 203 of this type. The supporting frame 202 can be produced from aluminum. Alternatively, the supporting frame 202 can also be produced from a different material, such as steel, for example. Optionally, the supporting frame 202 is produced from an electrically conductive material.

The sensor frame 201 is mechanically decoupled from the supporting frame 202. The sensor frame 201 can be produced from a ceramic material, such as silicon carbide (SiC/SiSiC), or from a steel material. A multiplicity of sensors can be provided on the sensor frame 201, the sensors being configured to detect the positioning of the optical element 203 or of the optical elements 203. With the aid of the position of the optical element 203 that is determined by the sensors, the alignment of the optical element can be corrected with the aid of the actuators provided on the supporting frame 202.

Mechanical decoupling of the supporting frame 202 from the sensor frame 201 should be understood to mean that no or at least negligible oscillations, forces and/or vibrations are transmitted from the supporting frame 202 to the sensor frame 201, and vice versa. This can be achieved by the sensor frame 201 being mounted with the aid of a soft mounting or actuator system. By way of example, the sensor frame 201 can be mounted with the aid of very soft spring elements.

The sensor frame 201 and the supporting frame 202 are arranged such that there is a spacing 205 between them. In the orientation of FIG. 3, the spacing 205 forms a spacing along an x-direction between the sensor frame 201 and the supporting frame 202. For example, a width of the spacing 205 along the x-direction is 15 cm.

The mounting 200 further comprises a fastening element 204, which is formed as a screw 213 made of X90 steel and a nut 212. To secure the fastening element 204, a first opening 206 is provided on the supporting frame 202 and a second opening 207 is provided on the sensor frame 201. The first opening 206 in the supporting frame 202 is a through hole that completely pierces the supporting frame 202. The second opening 207 is a hole that extends merely a few millimeters into the sensor frame 201.

A diameter r of the openings 206, 207 and of a cylindrical portion 210 of the screw 213, which extends between a screw head 209 and an end portion 211, is 12 mm. The screw 213 is configured as an M12 screw. A length L of the screw 213 along the axial direction of extent (x-direction or longitudinal direction) is 20 cm.

The screw 213 acts together with a nut 212 as a tension/compression element 204, which prevents movement of the sensor frame 201 relative to the supporting frame 202 along the x-direction. In this case, both a relative movement of the sensor frame 201 with respect to the supporting frame 202 and a relative movement of the sensor frame 201 away from the supporting frame 202 is prevented.

Since the screw 213 is significantly longer than wide (i.e. L>r), it is formed rigidly (is not bendable) only along the x-direction. It is designed to be bendable along the y- and z-directions. This gives rise to the fact that the force F exerted by the fastening element 204 on the sensor frame 201 acts exclusively along the rigid direction, here the x-direction. The fastening element 204 thus merely exerts a force F in the axial direction on the sensor frame 201.

Along the y- and z-directions, the screw 213 is bendable because of its length L, and it does not transmit any forces along these directions. Radial forces and also shearing forces are negligibly small or non-existent.

The fastening element 204 shown in FIG. 3 secures the sensor frame 201 relative to the supporting frame 202 along the direction of a degree of freedom, which corresponds to the x-direction. The force F exerted by the fastening element 204 on the mounted element 201 likewise extends along the x-direction of the degree of freedom.

In the illustration of FIG. 3 only a part of the mounting 200 is shown. The illustrated part of the mounting 200 comprises merely one single fastening element 204, while the entire mounting 200 comprises a plurality of fastening elements 204 acting jointly on the mounted element 201. An example of such a bearing 200 according to the first embodiment is shown in FIG. 4.

Figure 4:
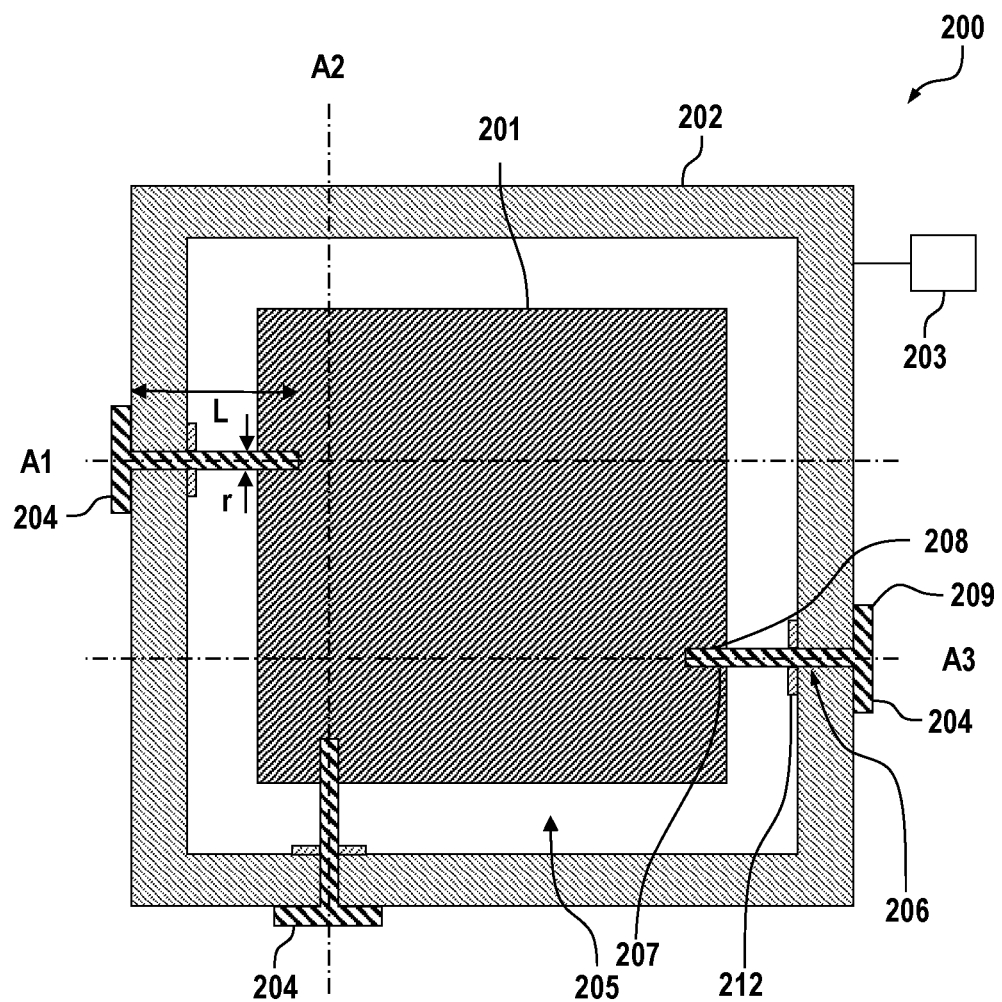
FIG. 4 shows a schematic view of the mounting according to the first embodiment.
Figure 4:
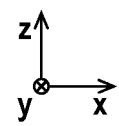

The provision of a plurality of fastening elements 204, as shown in FIG. 4, can mean that the sensor frame 201 can be secured on the supporting frame 202 by fastening elements 204, wherein each fastening element 204 exerts a force F exclusively in a single direction on the sensor frame 201.

In the example of FIG. 4, the supporting frame 202 has a frame shape and encloses the sensor frame 201 on all sides. The 15 cm wide spacing 205 between the sensor frame 201 and the supporting frame 202 extends around all sides of the sensor frame 201, and therefore the sensor frame 201 does not directly touch the supporting frame 202 anywhere.

As shown in FIG. 4, the mounting 200 comprises three fastening elements 204 according to the first embodiment. The fastening elements 204 are each designed identically to one other and correspond to the tension/compression element 204, which has been described in conjunction with FIG. 3.

The fastening elements 204 are arranged in FIG. 4 along three different axes A1, A2 and A3. The axes A1 and A3 run parallel but not coaxially to each other and extend along the x-direction. The axis A2 runs along the z-direction. The arrangement shown in FIG. 4 with three fastening elements 204 allows a two-dimensional securing of the sensor frame 201 relative to the supporting frame 202, namely in the x-z plane. The mounting 202 prevents any movement of the sensor frame 201 relative to the supporting frame 202 in the three degrees of freedom: translational movements along the x-direction, translational movements along the z-direction and rotational movements are prevented.

Each fastening element 204 exerts a force F on the sensor frame 201 merely in the axial direction. This force F is in each case exerted along the axis A1, A2, A3 associated with the fastening element 204.

For complete three-dimensional securing of the sensor frame 201 relative to the supporting frame 202, the mounting 200 of FIG. 4 can be supplemented by further fastening elements 204. With six tension/compression elements 204, which are arranged along axes decoupled from one another, the three-dimensional securing of the sensor frame 201 relative to the supporting frame 202 can be made possible. For this purpose, the mounting 200 in the y-z plane may have a further three fastening elements 204, which are arranged analogously to those in the x-z plane, which is shown in FIG. 4.

Using tension/compression elements 204 can be desirable because merely one fastening element 204 has to be provided per degree of freedom, which is intended to be fixed. As a result, the construction space which is provided for the fastening elements 204 on the sensor frame 201 and on the supporting frame 202 can be reduced. Furthermore, the effort with which the fastening elements 204 are mounted can be reduced with a lower number of fastening elements 204.

Instead of being configured as tension/compression elements as in FIGS. 3 and 4, the fastening elements 204 can also be configured as tension elements, which exert merely a tensile force F on the mounted element 201. This is shown in FIGS. 5 and 6.

Figure 5:
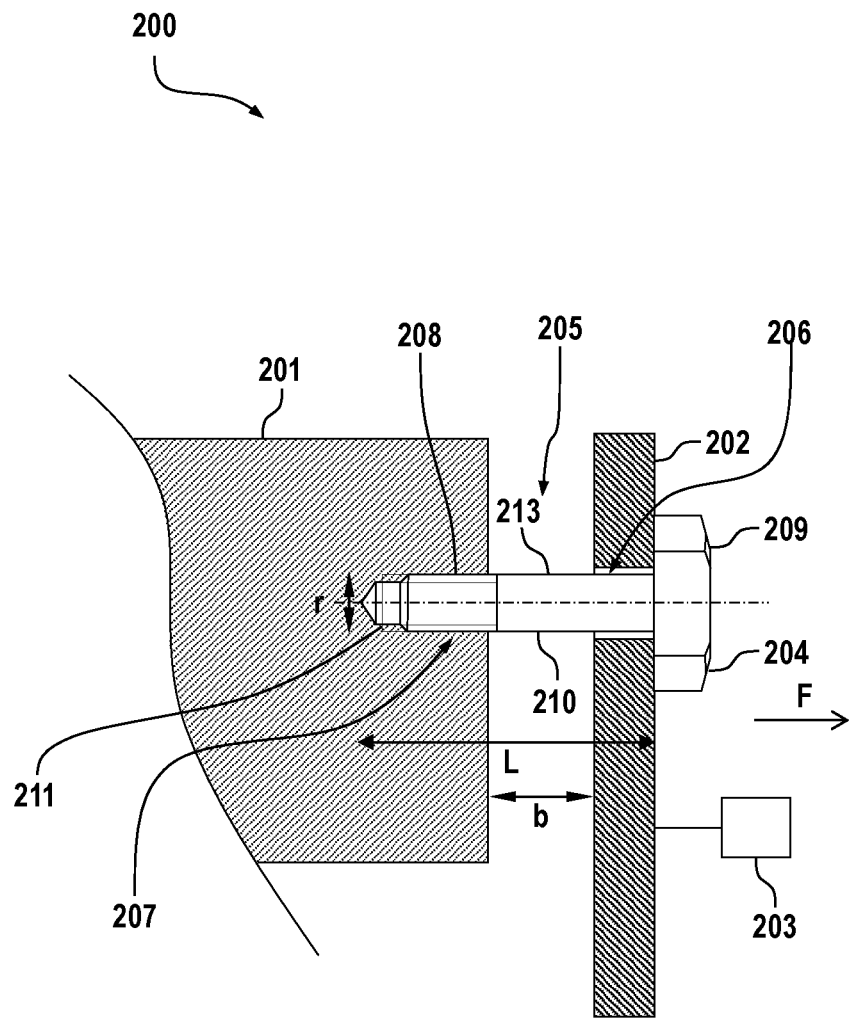
FIG. 5 shows a schematic sectional view of a part of a mounting according to a second embodiment.

In this case, the illustration of FIG. 5 corresponds to that of FIG. 3, the fastening element 204 comprising merely a screw 213 but no nut 212. Tightening the fastening element 204, which is configured as a tension element, causes the latter to pull the sensor frame 201 and the supporting frame 202 together. In this case, the fastening element 204 exerts a tensile force F on the sensor frame 201. The tensile force F exerted on the sensor frame 201 acts exclusively along a single direction, here the x-direction. The fastening element 204 thus merely exerts a force F in the axial direction on the sensor frame 201. Radial forces and also shearing forces are negligibly small or non-existent. The dimensions of the screw 213, in particular the length L and the diameter (width) r, are identical to those of the fastening element 204 of FIG. 3.

Figure 6:
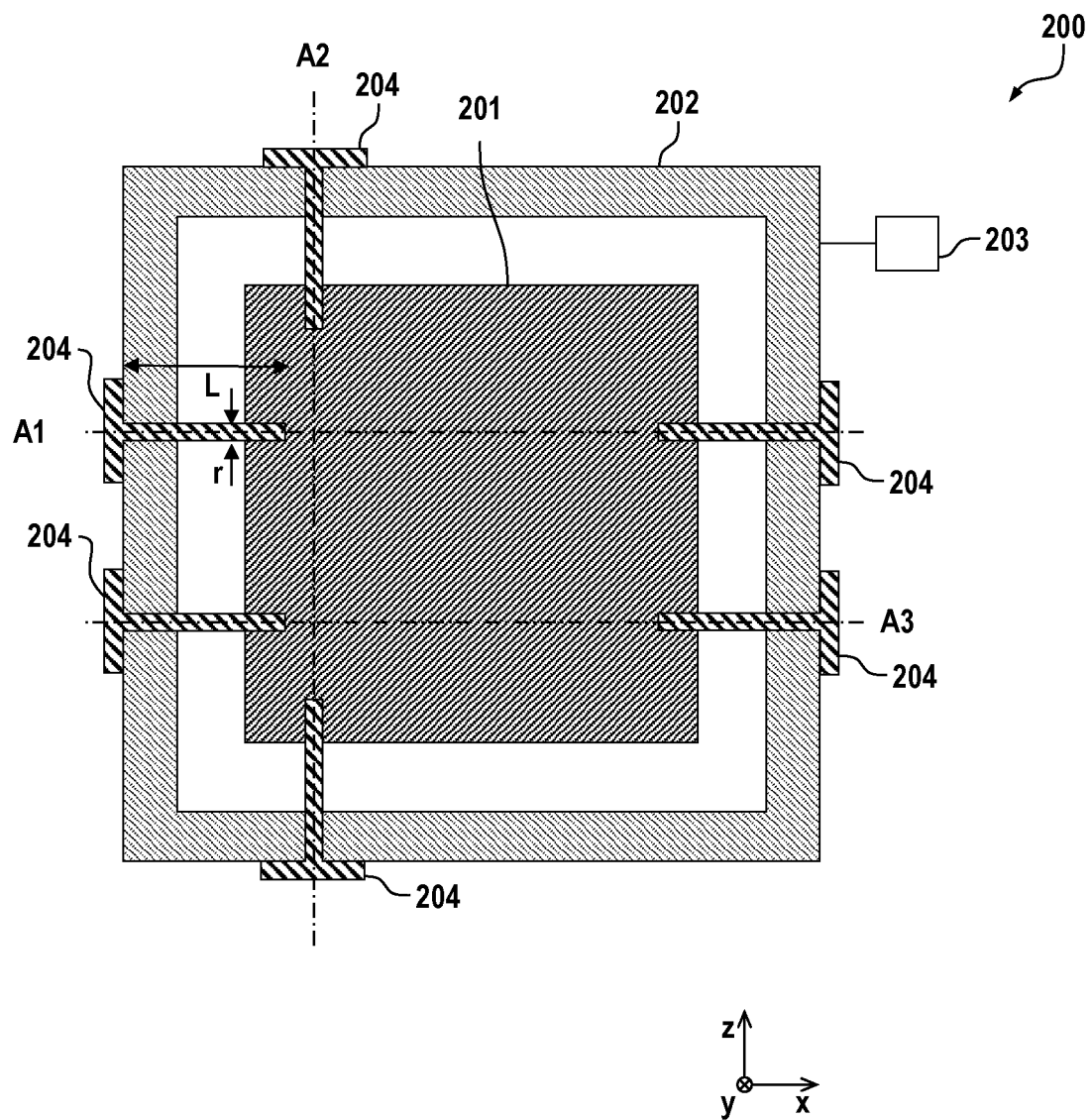
FIG. 6 shows a schematic view of the mounting according to the second embodiment.

Since the fastening elements 204 of the second embodiment (FIGS. 5 and 6) are configured as pure tension elements, two coaxial fastening elements 204 are arranged in each case in the mounting 200 which is shown in FIG. 6, the fastening elements exerting opposite tensile forces on the sensor frame 201 and thus securing the latter relative to the supporting frame 202. In each case two fastening elements 204 are arranged along the axes A1, A2 and A3.

As shown in FIG. 6, the mounting 200 comprises six fastening elements 204 in order to secure the sensor frame 201 two-dimensionally (in the x-z plane) relative to the supporting frame 202. For three-dimensional securing of the sensor frame 201 relative to the supporting frame 202, the mounting 200 of FIG. 6 can be supplemented by further fastening elements 204. With twelve tension/compression elements 204, which are arranged along six axes decoupled from one another, the three-dimensional securing of the sensor frame 201 relative to the supporting frame 202 can be made possible. In this case, two fastening elements are arranged coaxially, as also shown in FIG. 6. For this purpose, the mounting 200 in the y-z plane may have a further six fastening elements 204, which are arranged analogously to those in the x-z plane, which is shown in FIG. 6.

Although the present disclosure has been described with reference to exemplary embodiments, it is modifiable in various ways.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Mounting
201 Mounted element
202 Mounting element
203 Optical element
204 Fastening element
205 Spacing
206 First opening
207 Second opening
208 Thread
209 Screw head
210 Cylindrical portion
211 End portion
212 Nut
213 Screw
300 Mounting
301 Sensor frame
302 Supporting frame
303 Transport lock
304 Screw
305 Spacing
306 Gap
307 Receptacle
A1 Axis
A2 Axis
A3 Axis
b Width
F Force
L Length
M1 Mirror
M2 Mirror
M3 Mirror
M4 Mirror
M5 Mirror
M6 Mirror
r Diameter

What is claimed is:

1. A mounting, comprising:
an optical element;
a sensor frame;
a supporting frame configured to carry the optical element; and
fastening elements which together secure the sensor frame relative to the supporting frame in a degree of freedom, wherein:
the fastening elements are removably coupled to the sensor frame and the supporting frame;
a spacing is present in the direction of the degree of freedom between the sensor frame and the supporting frame; and
each fastening element exerts a force on the sensor frame exclusively in the direction of the degree of freedom.

2. The mounting of claim 1, wherein each fastening element exerts exclusively a tensile force and/or a compressive force on the sensor frame.

3. The mounting of claim 1, wherein the fastening elements are rigid only in the direction of the degree of freedom.

4. The mounting of claim 1, wherein, apart from the fastening elements, the sensor frame and the supporting frame are mechanically decoupled from each other.

5. The mounting of claim 1, wherein:
the fastening elements together secure the sensor frame relative to the supporting frame in a plurality of degrees of freedom;

a spacing is present between the sensor frame and the supporting frame in a direction of each degree of freedom; and for each degree of freedom, a fastening element exerts a force on the sensor frame exclusively in the direction of the degree of freedom.

6. The mounting of claim 5, wherein the fastening elements comprise at least six fastening elements, and each fastening element exerts a force on the sensor frame exclusively in a direction of a different degree of freedom.

7. The mounting of claim 1, wherein at least two of the fastening elements exert a force on the sensor frame in the same degree of freedom.

8. The mounting of claim 7, wherein the at least two fastening elements are coaxial so that their forces act on the sensor frame in opposite directions.

9. The mounting of claim 7, wherein the fastening elements comprise at least twelve fastening elements, and at least two of the fastening elements are coaxial.

10. The mounting of claim 1, wherein each fastening element exerts exclusively a compressive force on the sensor frame in the direction of the degree of freedom.

11. The mounting of claim 1, wherein each fastening element exerts exclusively a tensile force on the sensor frame in the direction of degree of freedom.

12. The mounting of claim 1, wherein the supporting frame comprises a first opening, the sensor frame comprises a second opening opposite the first opening, and a fastening element at least partially projects into the first and second openings.

13. The mounting of claim 12, wherein the fastening element comprises a pin or a screw.

14. The mounting of claim 1, wherein each fastening element exerts exclusively a tensile force and/or a compressive force on the sensor frame, and the fastening elements are rigid only in the direction of the degree of freedom.

15. The mounting of claim 1, wherein:

each fastening element exerts exclusively a tensile force and/or a compressive force on the sensor frame; and apart from the fastening elements, the sensor frame and the supporting frame are mechanically decoupled from each other.

16. The mounting of claim 1, further comprising an optical element, wherein the supporting frame carries the optical element, the sensor frame is a sensor frame, and each fastening element exerts exclusively a tensile force and/or a compressive force on the sensor frame.

17. The mounting of claim 1, wherein:

the fastening elements together secure the sensor frame relative to the supporting frame in a plurality of degrees of freedom;

a spacing is present between the sensor frame and the supporting frame in a direction of each degree of freedom;

for each degree of freedom, a fastening element exerts a force on the sensor frame exclusively in the direction of the degree of freedom; and each fastening element exerts exclusively a tensile force and/or a compressive force on the sensor frame.

18. An apparatus, comprising:

a mounting according to claim 1, wherein the apparatus is a lithography apparatus.

* * * * *